(12) United States Patent
Bakulich

(10) Patent No.: US 9,384,920 B1
(45) Date of Patent: Jul. 5, 2016

(54) LOCKING KNOB

(76) Inventor: Eric J. Bakulich, Rocklin, CA (US)

(*) Notice: Subject to any disclaimer, the term of this patent is extended or adjusted under 35 U.S.C. 154(b) by 1095 days.

(21) Appl. No.: 13/439,799

(22) Filed: Apr. 4, 2012

Related U.S. Application Data

(60) Provisional application No. 61/471,383, filed on Apr. 4, 2011.

(51) Int. Cl.
| | |
|---|---|
| *F16H 35/18* | (2006.01) |
| *G05G 1/10* | (2006.01) |
| *H01H 19/11* | (2006.01) |
| *H03J 5/10* | (2006.01) |

(52) U.S. Cl.
CPC . *H01H 19/11* (2013.01); *H03J 5/10* (2013.01)

(58) Field of Classification Search
CPC ............. H03J 5/06; H03J 5/10; H01H 25/06; H01H 19/11; Y10T 74/14; Y10T 74/1453; Y10T 74/1494
USPC ............. 74/10 R, 10.1, 10.41, 485, 504, 553; 200/11 R, 566; 334/88; 340/870.08
See application file for complete search history.

(56) References Cited

U.S. PATENT DOCUMENTS

| | | | | |
|---|---|---|---|---|
| 2,797,591 | A * | 7/1957 | Marrapese | 74/528 |
| 3,418,857 | A * | 12/1968 | Klein | H03J 1/06 |
| | | | | 192/89.29 |
| 3,965,775 | A * | 6/1976 | Pinkesfeld | B23Q 16/06 |
| | | | | 74/813 R |
| 4,899,021 | A * | 2/1990 | Daniel | 200/43.13 |
| 4,993,280 | A * | 2/1991 | Olkoski et al. | 74/553 |
| 5,159,706 | A * | 10/1992 | Hodsdon | 455/90.3 |
| 5,345,050 | A * | 9/1994 | Branch et al. | 200/341 |
| 5,862,715 | A * | 1/1999 | Lemire | 74/553 |
| 2015/0053043 | A1* | 2/2015 | Livolsi | 74/553 |

\* cited by examiner

*Primary Examiner* — Adam D Rogers
(74) *Attorney, Agent, or Firm* — Eric Karich; Karich & Associates

(57) ABSTRACT

A locking knob has a mounting base and a knob. The mounting base is shaped to be mounted to a fixed base of an electronic device, and includes a knob receiver extending upwardly to form a knob receiving portion. The knob has a knob top that is adapted to be grasped for manipulating the knob. The knob is positioned in the knob receiving portion of the knob receiver to operably engage a shaft of the electronic device so that the knob can be used to turn the shaft. A position selection mechanism enables locking the knob in either a lowered position or a raised position, and a locking feature of the knob interlocks with the locking base when the knob is in the lowered position, but leaves the knob free to rotate when in the raised position.

4 Claims, 5 Drawing Sheets

LOCKING KNOB

CROSS-REFERENCE TO RELATED APPLICATIONS

This application for a utility patent claims the benefit of U.S. Provisional Application No. 61/471,383, filed Apr. 4, 2011.

STATEMENT REGARDING FEDERALLY SPONSORED RESEARCH

Not Applicable

BACKGROUND OF THE INVENTION

1. Field of the Invention

This invention relates generally to controls for an electronic device, and more particularly to a locking knob for selectively enabling control of an electronic device such as a radio.

2. Description of Related Art

Electronic devices, such as radios, are sometimes controlled by knobs such that when the knobs are turned, settings are modified. Commonly used controls utilized in the operation of a radio include a volume control and a channel control.

It is sometimes desirable to lock the radio to specific settings. For example, a particular volume might be selected, so that the volume is not accidentally set to zero. Another example, a particular emergency channel may be desired, and it may be important that the channel not be inadvertently changed during use.

At the same time, it is desirable that the knobs be quickly and easily turned to other settings when desired, without requiring undue effort to change a setting. A safety device for locking particular settings is therefore desirable, while enabling modifications to be easily made when desired.

SUMMARY OF THE INVENTION

The present invention teaches certain benefits in construction and use which give rise to the objectives described below.

The present invention provides a locking knob for controlling the function of an electronic device. The locking knob includes a mounting base and a knob. The mounting base is shaped to be mounted to the fixed base of the electronic device, and includes a knob receiver extending upwardly to form a knob receiving portion. The knob has a knob top that is adapted to be grasped for manipulating the knob, and also includes a knob body having a knob side surface with a top groove and a bottom groove. The knob is positioned in the knob receiving portion of the knob receiver to operably engage the shaft so that the knob can be used to turn the shaft. A position selection mechanism enables locking the knob in either a lowered position or a raised position. A locking feature of the knob interlocks with the locking base when the knob is in the lowered position, but leaves the knob free to rotate when in the raised position.

A primary objective of the present invention is to provide a locking knob having advantages not taught by the prior art.

Another objective is to provide a locking knob that maintains certain selected settings, preventing important settings from being changed inadvertently during use.

A further objective is to provide a locking knob that can be easily unlocked so that the settings may be changed when desired.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings.

DETAILED DESCRIPTION OF THE INVENTION

The above-described drawing figures illustrate the invention, a locking knob 10 adapted to be installed on an electronic device 12 (e.g., a radio) that includes an adjustment mechanism for adjusting a function of the electronic device (e.g., a volume control and a channel selector of the radio). While the radio is used in the present embodiment, other electronic devices may utilize the locking knob 10, and should be considered within the scope of the present invention.

Figure 1:
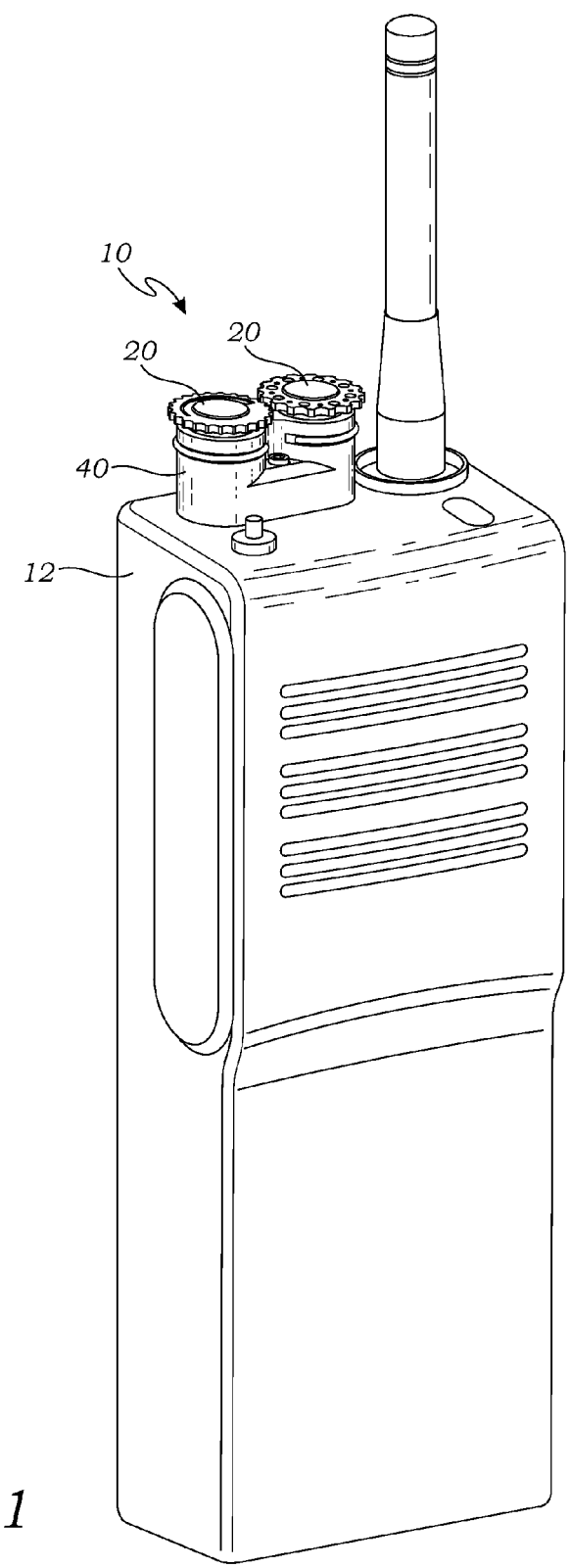
FIG. 1 is a perspective view of a radio having one embodiment of a pair of locking knobs installed on the radio, for locking a volume control and a channel selector of the radio.

FIG. 1 is a perspective view of the radio 12 having one embodiment of the locking knob 10 installed. In this embodiment, there are two locking knobs 10 integrated into a single unit, a pair of locking knobs 10, for locking a volume control and a channel selector of the radio.

In alternative embodiments, a single locking knob 10 might be used, or multiple locking knobs 10 in alternative configurations.

Figure 2:
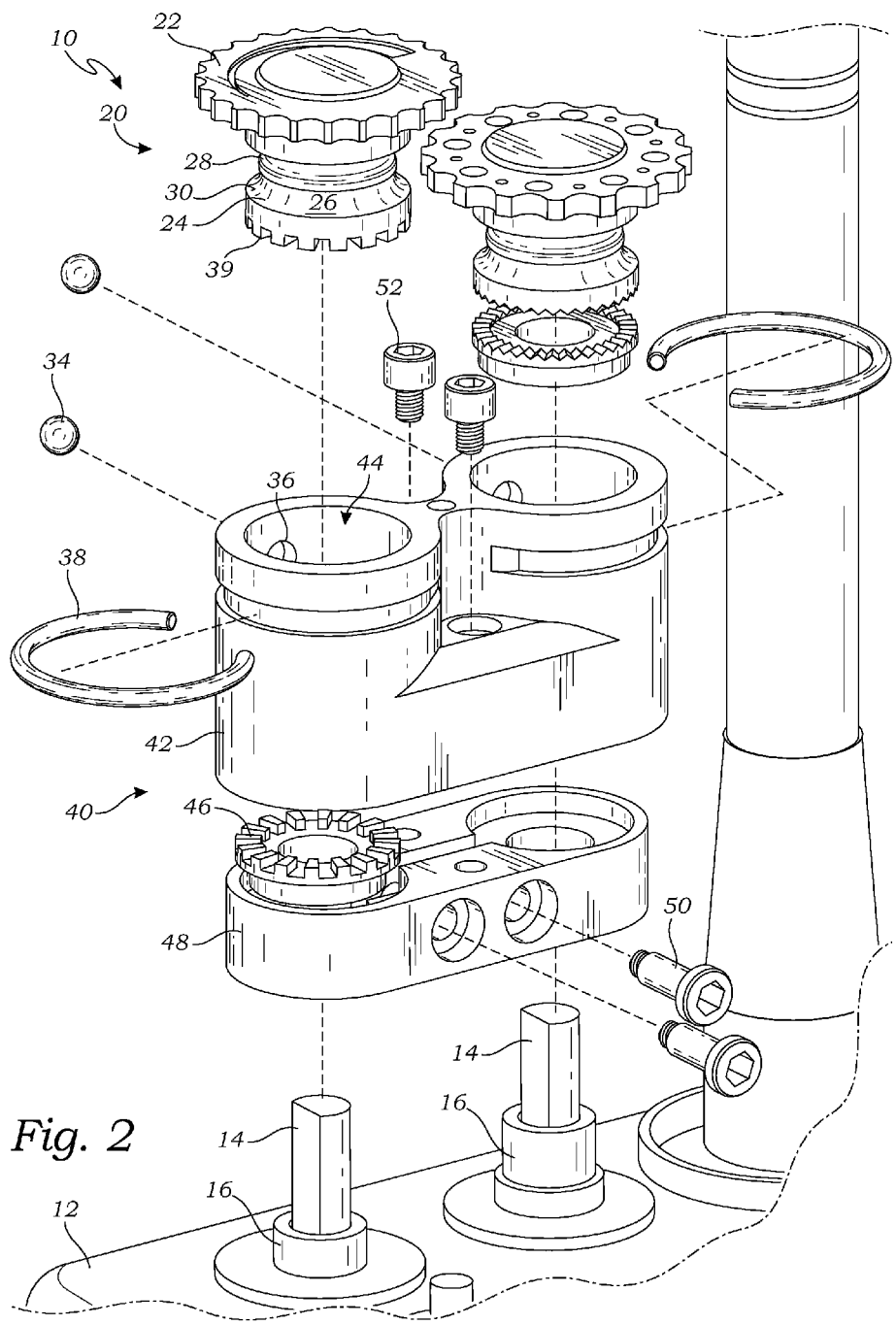
FIG. 2 is an exploded perspective view thereof.

FIG. 2 is an exploded perspective view of the pair of locking knobs 10 of FIG. 1. As illustrated in FIG. 2, each locking knob 10 includes a knob 20 and a knob receiver 40. The knob 20 is adapted to be turned and otherwise manipulated, and the knob receiver 40 is adapted to be mounted on the radio and for receiving the knob 20. The knob receiver 40 may be mounted to a fixed base 16 of the radio so that the knob 20 may be operably mounted on the shaft 14 for controlling the function of the radio 12.

The knob 20 includes a knob top 22 that is adapted to be grasped by the user's fingers for turning and manipulating the knob 20. The knob 20 also includes a position selection mechanism for locking the knob 20 in either a lowered position or a raised position, discussed in greater detail below.

In one embodiment, the knob 20 may include a knob body 24 having a knob side surface 26. In this embodiment, the position selection mechanism includes a top groove 28 and a bottom groove 30 in the knob side surface 26, and a bearing 34. The top and bottom grooves 28 and 30 may be annular grooves, and may be shaped to lockingly receive the bearing 34, which may be positioned in a side aperture 36 of the knob receiver 40 for locking the knob 20 in either the lowered position or the raised position. The position selection mechanism may also include a biasing element 38 that biases the bearing 34 against the knob side surface 26 and into the top or bottom groove 28 and 30. The biasing element 38 in the present embodiment is a C-shaped spring, or a resilient ring, or other similar or equivalent structure. The function of these elements is discussed in greater detail below. While one embodiment of the position selection mechanism is discussed herein, alternative mechanisms for locking the position of the knob 20 may be devised by those skilled in the art, and such alternatives should be considered within the scope of the present invention.

The knob body 24 also includes a locking feature 39 such as a locking surface for locking the position of the knob 20 with respect to the knob receiver 40. The knob receiver 40 includes a receiver housing 42 that defines a knob receiving portion 44 shaped to receive the knob body 24. The knob receiving portion 44 may include a base locking surface 46 that includes mating gears, grooves, or similar locking features to interlock with the locking surface 39 of the knob 20. In the present embodiment, the locking feature 39 includes gears, grooves, or similar locking elements, as discussed in greater detail below, such that when they are engaged (in the lowered position), the knob 20 cannot rotate with respect to the radio 12. When the knob 20 is in the raised position, however, the locking features 39 and the base locking surface 46 do not engage, and so the knob 20 can be rotated to adjust the settings of the radio 12.

While the base locking surface 46 is illustrated as a separate insert that is positioned within the knob receiving portion 44, the base locking surface 46 may also be formed directly into the locking base (including any portion of the knob receiver 40, or associated structures). Such alternatives are considered to be within the scope of the present invention.

In one embodiment, the knob receiver 40 further includes a mounting base 48 that is adapted to be attached to the radio such that a shaft 14 of the function of the radio (i.e., the volume control and/or channel selector) extends into the knob receiving portion 44 to engage a bore 32 shaped to frictionally engage the shaft 14. The mounting base 48 may clamp the fixed base 16 when a clamping element 50 (e.g., screws, other clamping features) is tightened. In this embodiment, the receiver housing 42 may be attached to the mounting base 48 with fasteners 52 or other means.

Figure 3:
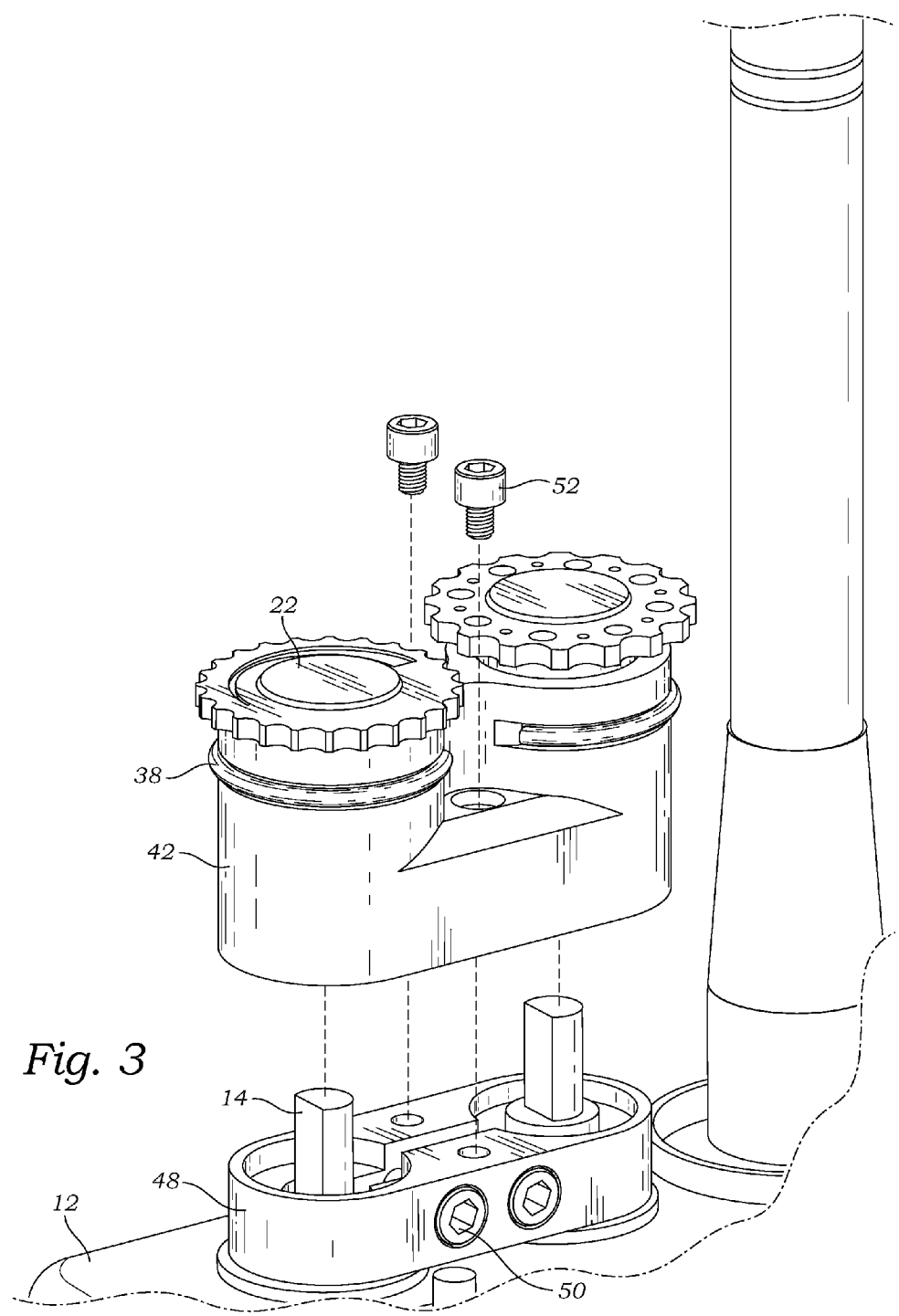
FIG. 3 is an exploded perspective view thereof, illustrating a mounting base of the pair of locking knobs installed on the radio.

FIG. 3 is an exploded perspective view thereof, illustrating the mounting base 48 of the pair of locking knobs 10 installed on the radio. Once the mounting base 48 is mounted on the radio as illustrated, or using alternative attachment means, the knob receiver 40 may be fastened to the mounting base 48, and the knobs 20 may be installed in the knob receiver 40.

Figure 4:
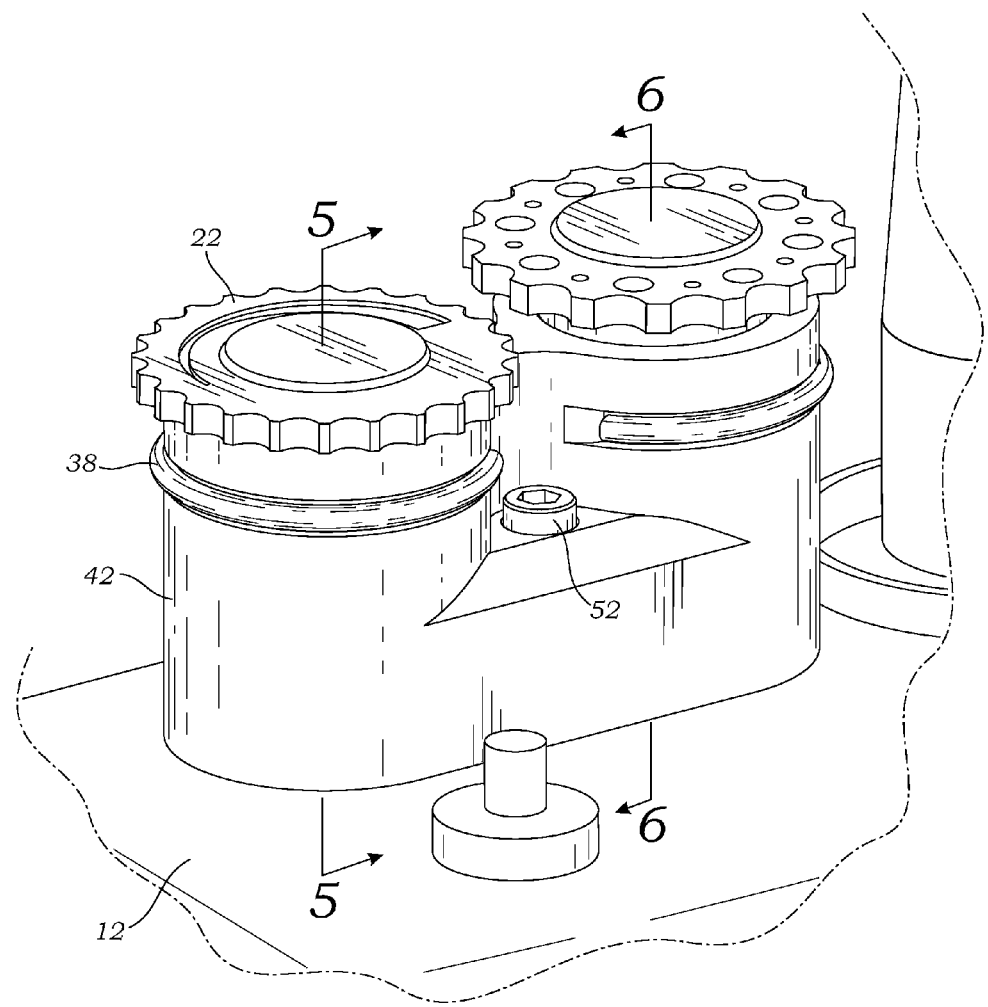
FIG. 4 is a perspective view of the pair of locking knobs installed on the radio, illustrating one of the pair of locking knobs in a lowered, locked position, and another of the pair of locking knobs in a raised, unlocked position.
Figure 5:
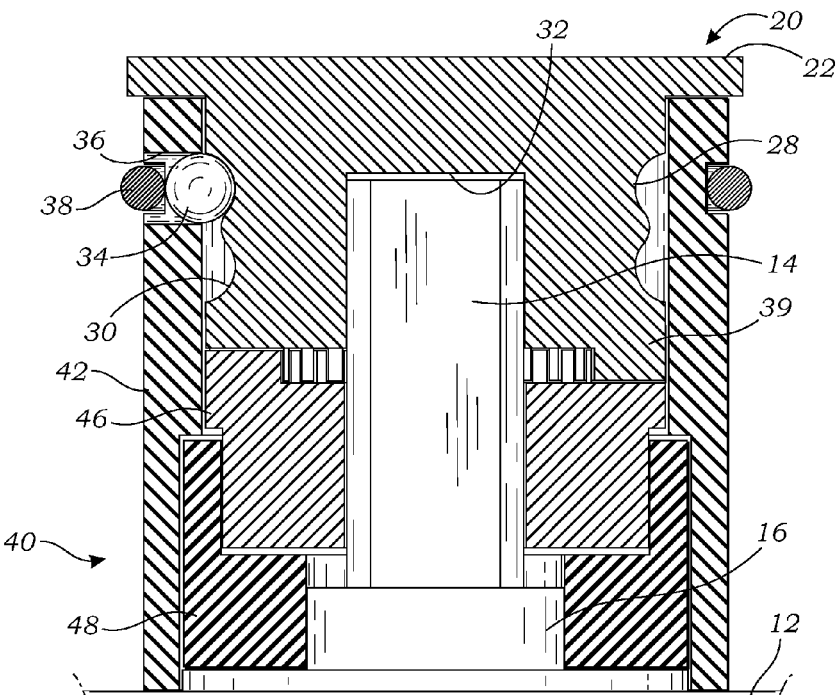
FIG. 5 is a sectional view thereof taken along the line 5-5 in FIG. 4, illustrating.
Figure 6:
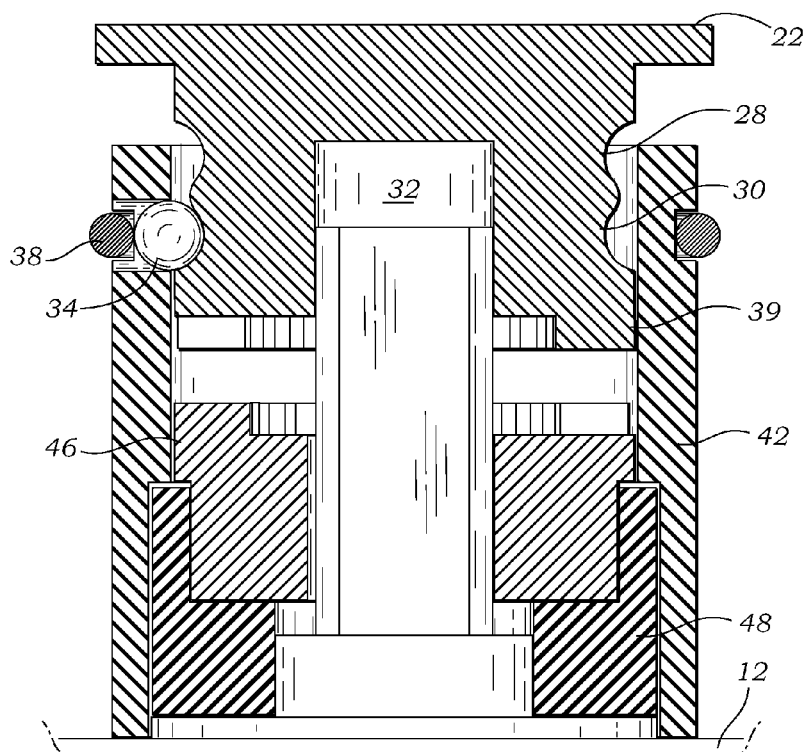
FIG. 6 is a sectional view thereof taken along the line 6-6 in FIG. 4.

FIG. 4 is a perspective view of the pair of locking knobs 10 installed on the radio, illustrating one of the pair of locking knobs 10 in a lowered, locked position, and another of the pair of locking knobs 10 in a raised, unlocked position. FIG. 5 is a sectional view thereof taken along the line 5-5 in FIG. 4. FIG. 6 is a sectional view thereof taken along the line 6-6 in FIG. 4.

As illustrated in FIGS. 4-5, one of the knobs 20 is positioned in a lowered position, wherein the bearing 34 engages the top groove 28, and the locking surface 39 of the knob 20 engages the base locking surface 46, and prevents twisting of the knob 20, thereby preventing the shaft 14 from being rotated, and preserving the preferred setting on the radio. The bearing 34 and top groove 28 maintain the knob 20 in the lowered position.

As illustrated in FIGS. 4 and 6, the other of the knobs 20 has been lifted to a raised position, wherein the bearing 34 engages the bottom groove 30, and the locking surface 39 of the knob 20 is disengaged from the base locking surface 46, and is thereby free to rotate for adjusting the control of the radio. The bearing 34 and bottom groove 30 maintain the knob 20 in the raised position until the user presses the knob 20 down and back to the lowered position.

While the present embodiment includes a pair of locking knobs 10, it is also contemplated that single locking knob 10 might be utilized using a similar or equivalent structure, or more than two might be used. While the base locking surface 46 is illustrated as a separate component that is clamped in the mounting base 48, it may be machined directly into the mounting base 48, or into other parts of the knob receiver 40.

While the present embodiment illustrated in FIGS. 1-6 shows an after-market product attached to particular points on the radio 12, it is also within the scope of the invention to integrate the product into a radio directly. The fixed base 16 is hereby defined to include other parts of the radio 12 that are fixed with respect to the shaft 14. The clamping elements described above may be replaced with other attachment mechanisms or connections.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

What is claimed is:

1. A locking knob for controlling the function of an electronic device, the electronic device having a fixed base and a shaft that is rotatably mounted for controlling the operation of the electronic device, the locking knob comprising:
   a mounting base shaped to be mounted to the fixed base of the electronic device, the mounting base including a knob receiver extending upwardly to form a knob receiving portion;
   a knob having a knob top that is adapted to be grasped for manipulating the knob, the knob being positioned in the knob receiving portion of the knob receiver to operably engage the shaft so that the knob can be used to turn the shaft,
   the knob having a knob locking feature that includes gears or grooves;
   a base locking surface formed in the knob receiving portion of the mounting base, the base locking surface having mating gears or grooves to interlock with the gears or grooves of the locking feature of the knob;
   a position selection mechanism for locking the knob in either a lowered position or a raised position, wherein in the lowered position, the mating gears or grooves of the base locking surface interlock with the gears or grooves of the locking feature of the knob such that the knob cannot rotate, but when the knob is in the raised position, the mating gears or grooves of the base locking surface do not interlock with the gears or grooves of the locking feature of the knob, such that the knob can be rotated to for controlling the function of the electronic device,
   wherein the position selection mechanism includes:
   a top groove and a bottom groove in a knob side surface of the knob;
   a bearing positioned in a side aperture of the knob receiver; and
   a biasing element for biasing the bearing against the knob and into either the top groove or the bottom groove.

2. The locking knob of claim 1, wherein the biasing element is a C-shaped spring.

3. A locking knob for controlling the function of an electronic device, the electronic device having a fixed base and a shaft that is rotatably mounted for controlling the operation of the electronic device, the locking knob comprising:
- a mounting base shaped to be mounted to the fixed base of the electronic device;
- a knob receiver extending upwardly from the mounting base, the knob receiver having a side aperture containing a bearing;
- a knob having a knob top that is adapted to be grasped for manipulating the knob, and a knob body having a knob side surface with a top groove and a bottom groove, the knob being positioned in the knob receiver and operably engaging the shaft so that the knob can be used to turn the shaft;
- a biasing element that biases the bearing against the knob side surface and into either the top groove or the bottom groove, to receive the bearing of the knob receiver for locking the knob in either a lowered position or a raised position; and
- a locking feature of the knob for interlocking the knob with a locking base when the knob is in the lowered position, but leaving the knob free to rotate when in the raised position.

4. A radio, comprising:
- two fixed bases each having a shaft extending therefrom, the shafts being rotatably mounted for controlling the operations of the radio;
- a mounting base shaped to be mounted on the fixed bases of the radio, the mounting base including a knob receiver extending upwardly to form two knob receiving portions; and
- a pair of knobs for controlling the operation of the two shafts of the radio, each of the knobs comprising:
    - a knob top that is adapted to be grasped for manipulating the knob, and a knob body having a knob side surface with a top groove and a bottom groove, the knob being positioned in the knob receiving portion of the knob receiver to operably engage the shaft so that the knob can be used to turn the shaft;
    - a position selection mechanism for locking the knob in either a lowered position or a raised position; and
    - a locking feature of the knob for interlocking with a locking base when the knob is in the lowered position, but leaving the knob free to rotate when in the raised position.

\* \* \* \* \*